US008354293B2

(12) United States Patent
Vigier-Blanc et al.

(10) Patent No.: US 8,354,293 B2
(45) Date of Patent: Jan. 15, 2013

(54) METHOD OF MAKING AN IMAGING TABLET-LENS STRUCTURE COMPRISING AN INDEX OF REFRACTION THAT VARIES DIRECTIONALLY

(75) Inventors: Emmanuelle Vigier-Blanc, Le Sappey en Chartreuse (FR); Guillaume Cassar, Grenoble (FR)

(73) Assignee: STMicroelectronics S.A., Crolles (FR)

( * ) Notice: Subject to any disclaimer, the term of this patent is extended or adjusted under 35 U.S.C. 154(b) by 340 days.

(21) Appl. No.: 12/780,832

(22) Filed: May 14, 2010

(65) Prior Publication Data
US 2010/0221862 A1 Sep. 2, 2010

Related U.S. Application Data

(62) Division of application No. 11/964,921, filed on Dec. 27, 2007, now Pat. No. 7,868,284.

(30) Foreign Application Priority Data

Jan. 15, 2007 (FR) ...................................... 07 52665

(51) Int. Cl.
*H01L 21/00* (2006.01)
(52) U.S. Cl. ................ 438/65; 438/68; 438/69; 438/72; 257/291; 257/292; 257/432; 257/E31.127
(58) Field of Classification Search .................... 438/40, 438/65, 185, 584, 231, 246, 369, 68–69, 438/72, 551; 257/53, 56, 108, 467, E31.001, 257/291–292, 432, E31.127; 359/652, 654, 359/626, 628, 455, 741; 348/540
See application file for complete search history.

(56) References Cited

U.S. PATENT DOCUMENTS

| 4,639,094 | A | 1/1987 | Aono |
| 4,805,997 | A | 2/1989 | Asahara et al. |
| 5,062,688 | A | 11/1991 | Okuda et al. |
| 5,136,428 | A | 8/1992 | Ray |
| 5,808,806 | A | 9/1998 | Guhman et al. |
| 5,870,638 | A | 2/1999 | Kurosawa |
| 6,232,590 | B1 | 5/2001 | Baek |
| 7,876,504 | B2 | 1/2011 | Vigier-Blanc et al. |
| 2002/0044739 | A1* | 4/2002 | Vahala et al. ................... 385/30 |

(Continued)

FOREIGN PATENT DOCUMENTS

| EP | 1424570 A1 | 6/2004 |
| EP | 1785750 A1 | 5/2007 |
| EP | 1944808 A1 | 7/2008 |
| JP | 2002-148411 A | 5/2002 |
| WO | WO-2005/076361 A1 | 8/2005 |

OTHER PUBLICATIONS

Preliminary French Search Report, FR 07 52665, dated May 29, 2007. English Abstract for JP2002-148411.

*Primary Examiner* — Evan Pert
*Assistant Examiner* — Mark A Laurenzi
(74) *Attorney, Agent, or Firm* — Gardere Wynne Sewell LLP

(57) ABSTRACT

An imaging optical module is designed to be placed in front of an optical image sensor of a semiconductor component. The module includes at least one element which has a refractive index that varies between its optical axis and its periphery, over at least an annular part and/or over its central part. The element may be a tablet in front of the semiconductor sensor or a lens in front of the semiconductor sensor. The direction of variation in refractive index may be oppositely oriented with respect to the table and lens.

34 Claims, 8 Drawing Sheets

U.S. PATENT DOCUMENTS

| | | |
|---|---|---|
| 2004/0032523 A1 | 2/2004 | Hartlove et al. |
| 2006/0033176 A1 | 2/2006 | Mun |
| 2006/0082895 A1 | 4/2006 | Inoue et al. |
| 2006/0254316 A1 | 11/2006 | Leu |
| 2007/0035721 A1 | 2/2007 | Toshikiyo et al. |
| 2007/0069108 A1 | 3/2007 | Inaba |
| 2007/0145242 A1 | 6/2007 | Toyoda et al. |
| 2009/0190231 A1 | 7/2009 | Lenchenkov |

* cited by examiner

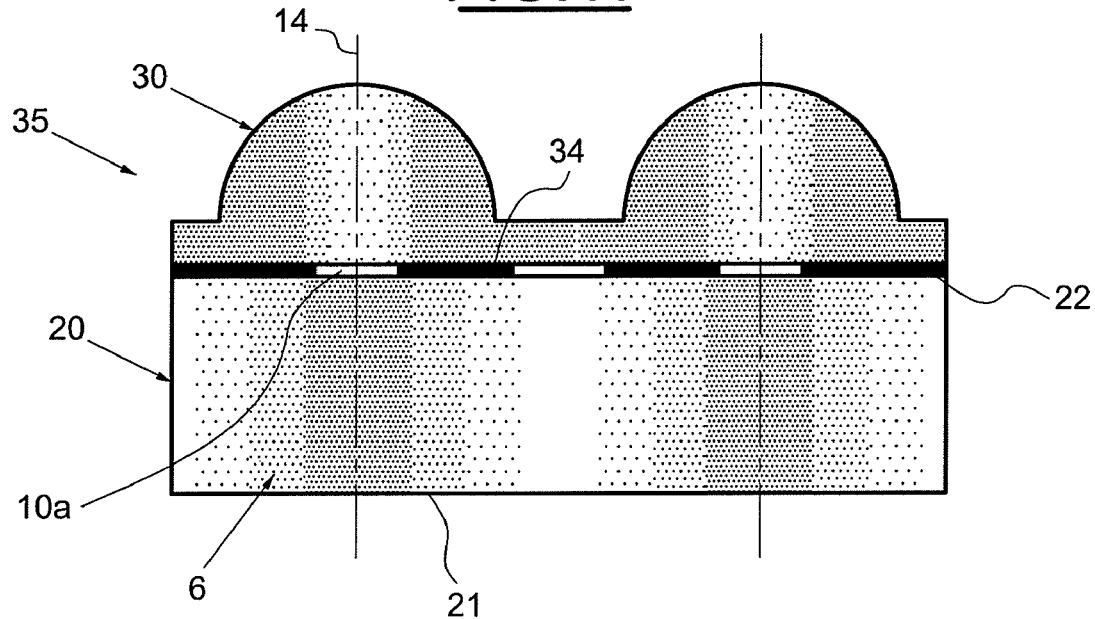
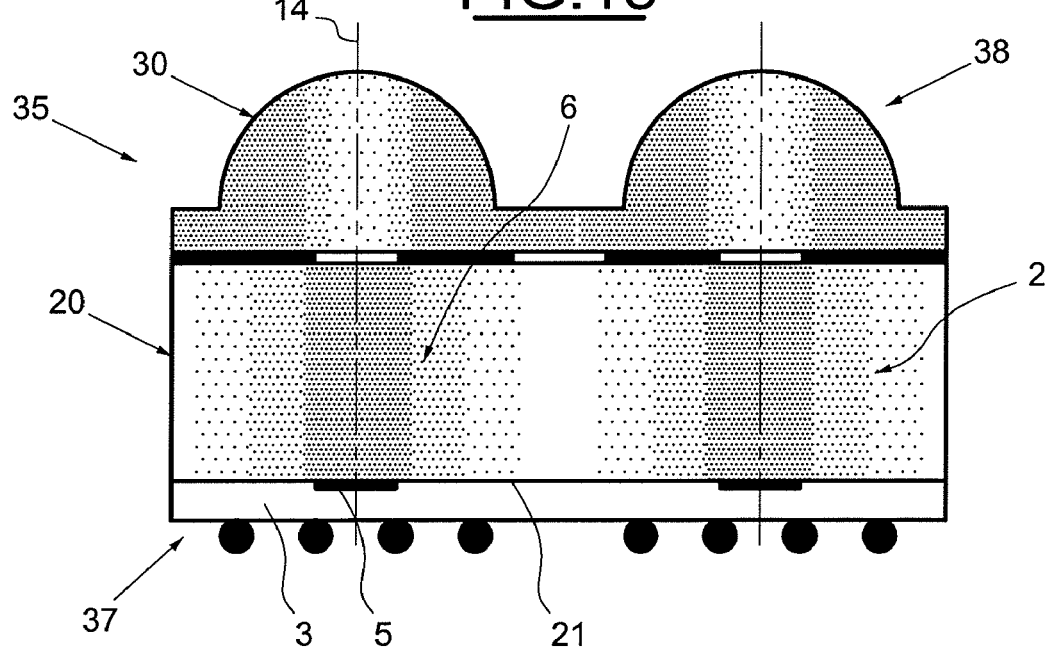

METHOD OF MAKING AN IMAGING TABLET-LENS STRUCTURE COMPRISING AN INDEX OF REFRACTION THAT VARIES DIRECTIONALLY

PRIORITY CLAIM

The present application is a divisional of U.S. application patent Ser. No. 11/964,921 filed Dec. 27, 2007, which is a translation of and claims priority from French Application for Patent No. 07 52665 of the same title filed Jan. 15, 2007, the disclosures of which are hereby incorporated by reference.

BACKGROUND OF THE INVENTION

1. Technical Field of the Invention

The present invention relates to the general field of cameras and, more particularly, the field of semiconductor components including optical image sensors in front of which are installed imaging optical modules for projecting images onto these optical image sensors.

2. Description of Related Art

It is currently known that such optical modules can comprise a glass lens, a glass tablet placed between the lens and the sensor and a diaphragm between the lens and the tablet. It is also known that such elements are advantageously stacked one on top of the other.

Nevertheless, there is currently a limit to the increase in the number of pixels forming the optical sensors because the captured images become blurred and/or have less contrast.

There is a need to improve the resolution power and/or the contrast of the imaging optical modules associated with optical semiconductor components, with a view to being able to increase the sharpness and/or the contrast of the images captured by the semiconductor components currently available and/or increase the number of pixels forming the optical image sensors of the components, without reducing the sharpness and/or the contrast of the captured images.

SUMMARY OF THE INVENTION

In an embodiment an imaging optical module is designed to be placed in front of an optical image sensor of a semiconductor component and through which an image is projected towards this optical image sensor.

This module can comprise at least one element which has a refractive index that varies between its optical axis and its periphery, over at least an annular part and/or over its central part.

According to a variant, the refractive index of said element can advantageously vary in one direction.

According to an embodiment, the imaging optical module comprises at least one element which has a refractive index that varies between its optical axis or its central part and its periphery.

According to an embodiment, the imaging optical module comprises at least a first element including a tablet with parallel faces and a second element including an optical lens, at least one of these elements having a refractive index that varies between its optical axis and its periphery, over at least an annular area.

Said elements can have refractive indices that vary in the reverse direction between their optical axis or their central part and their periphery.

The refractive index of said tablet can increase between its optical axis or its central part and its periphery.

The refractive index of said lens can decrease between its optical axis or its central part and its periphery.

In accordance with another embodiment, a method is presented for fabricating an imaging optical element designed to be placed in front of an optical image sensor of a semiconductor component and through which an image is projected towards this optical image sensor.

This method comprises the following step: doping the material forming said element with ions suitable for modifying the refractive index of this element, such that this index varies between its optical axis or its central part and its periphery, over at least an annular area.

The method comprises, previously, the following step: doping the material forming said element with different ions.

The method comprises, previously, a step for additionally doping the material forming said element with preliminary doping ions or with other ions.

In one aspect, the element is made of glass and the doping ions are chosen from the group of sodium, potassium, lithium, silver, cesium and thallium ions.

The method comprises the following step: doping with thallium ions an element made of glass previously doped with sodium ions.

The element can comprise a tablet.

According to an aspect, the method comprises the following step: doping with sodium ions an element made of glass previously doped with thallium ions.

Said element can comprise a lens.

The method comprises the following steps: forming on said element a mask having at least one annular aperture and/or a central aperture; doping the material forming this element through this mask; and removing said mask.

Another embodiment is a method of fabricating imaging optical elements designed to be placed in front of optical image sensors of semiconductor components and through which images are projected towards these optical image sensors.

This method comprises the following steps: taking a wafer; making crossed grooves, which may be rectilinear, in a front face of said wafer so as to form protruding blocks; forming a mask covering the rear face of said wafer, the end faces of said blocks and the bottom of said grooves; doping with ions the material forming said wafer through said mask, radially producing a doping of each of said blocks; and removing said mask; such that the refractive index of each block varies between its optical axis or its central part and its periphery.

Alternatively, the method comprises the following steps taking a wafer; forming on a front face of said wafer a mask comprising, over areas of this front face, a central aperture and/or at least one annular aperture; forming a mask covering the rear face of said wafer; doping with ions the material forming said wafer through said mask; and removing said masks; such that the refractive index of each part of said wafer corresponding to said areas varies between its optical axis or its central part and its periphery.

Another embodiment comprises a wafer with parallel faces comprising a multiplicity of parts respectively comprising imaging optical tablets designed to be placed in front of optical image sensors of semiconductor components and through which images are projected towards these optical image sensors, each tablet having a refractive index that varies between its optical axis and its periphery, over at least an annular part and/or over its central part.

Another embodiment comprises a wafer comprising a multiplicity of parts respectively forming imaging optical lenses designed to be placed in front of optical image sensors of semiconductor components and through which images are projected towards these optical image sensors, each optical lens having a refractive index that varies between its optical axis and its periphery, over at least an annular part and/or over its central part.

Another embodiment comprises an imaging optical device comprising said wafer with tablets and said wafer with lenses, joined together so that said optical elements and said optical lenses are placed one on top of the other and form optical modules.

Another embodiment is a method of fabricating optical semiconductor devices. This method comprises the following steps: joining together said wafer with tablets and said wafer with lenses so that said optical elements and said optical lenses are placed one on top of the other and comprise imaging optical modules; joining to said wafer with tablets a wafer comprising a multiplicity of parts respectively comprising semiconductor components with optical image sensors so that said imaging optical modules and said semiconductor components are placed one on top of the other; and sawing said joined wafers so as to cut out a multiplicity of semiconductor devices with optical image sensors respectively comprising a semiconductor component and an imaging optical module.

Another embodiment is an optical semiconductor package. This optical semiconductor comprises: a semiconductor component comprising an optical image sensor on its front face, an imaging optical module placed in front of the optical image sensor of the semiconductor component and through which an image is projected towards this optical image sensor, said imaging optical module comprising at least one element which has a refractive index varying between its optical axis and its periphery, over at least an annular part and/or over its central part.

The refractive index of said element of said package varies in one direction.

Said imaging optical module of said package comprises at least a first element comprising a tablet with parallel faces placed in front of the semiconductor component and a second element comprising an optical lens placed in front of said tablet, a diaphragm being inserted between said tablet and said lens, at least one of these elements having a refractive index varying between its optical axis and its periphery, over at least an annular area.

Said elements of said package have refractive indices varying in the reverse direction between their optical axis or their central part and their periphery.

The refractive index of said tablet of said package may increase between its optical axis or its central part and its periphery.

The refractive index of said lens of said package may decrease between its optical axis or its central part and its periphery.

BRIEF DESCRIPTION OF THE DRAWINGS

The present invention will be better understood from studying elements and optical modules designed to be placed in front of an optical sensor of a semiconductor component, and their fabrication methods, described by way of non-limiting examples and illustrated by the drawings in which:

FIG. 17 represents an assembly of the portions of FIGS. 11 and 16; and

FIG. 18 represents a mounting of the assembly of FIG. 17 on a wafer of semiconductor components.

DETAILED DESCRIPTION OF THE DRAWINGS

Figure 1:
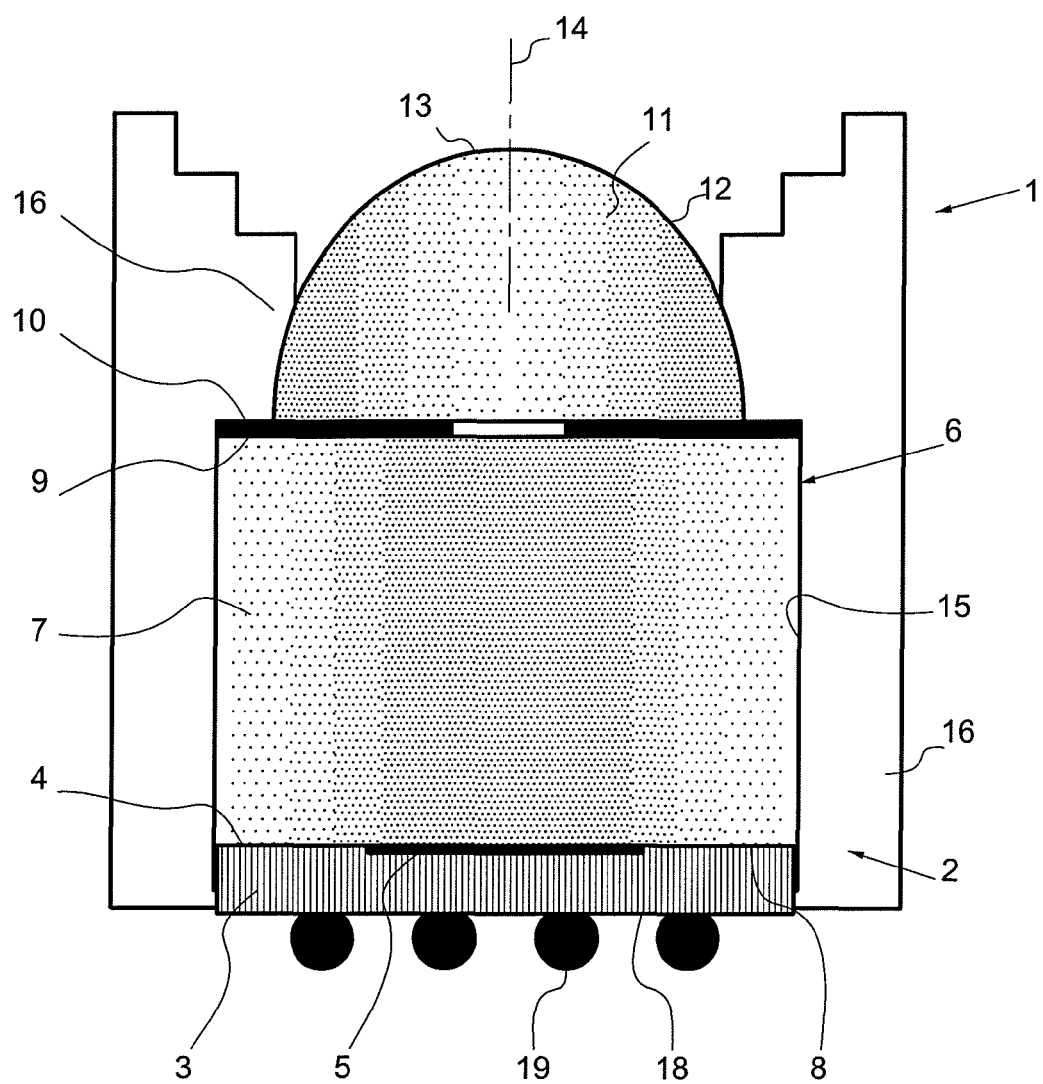
FIG. 1 represents an axial cross section of a package containing an optical module.

Referring to FIG. 1, it can be seen that an optical semiconductor package 1 is represented, comprising a stack 2 comprising a semiconductor component 3 which has on its front face 4 an optical image sensor 5, and an imaging optical module 6.

According to the present description, an optical image sensor is able to capture one or more images of a scene occurring in front of said package. Such an image sensor normally comprises a multiplicity of individual photodiodes respectively transforming a stream of photons into an electrical signal, forming pixels.

According to the present description, an imaging optical module 6 is an optical unit through which an optical image sensor sees said scene.

This imaging optical module 6 comprises a transparent tablet 7, preferably made of glass, of which the rear face 8 and the front face 9 are parallel, a diaphragm 10 and a front convergent lens 11, preferably made of glass, of which the rear face 12 is flat and the front face 13 is convex, for example hemispherical, the diaphragm 10 being interposed between the front face 9 of the tablet 7 and the rear face 12 of the lens 11.

The optical image sensor 5, the transparent tablet 7, the diaphragm 10 and the lens 11 have the same optical axis 14.

The stack 2 is housed axially in a through passage 15 of an opaque casing 16, the lens passing through an internal shoulder in this passage, forming a front end stop for the tablet 7. The rear face 18 of the semiconductor component 3 is provided with balls 19 for external electrical connection.

The tablet 7 has a refractive index that varies between its optical axis and its periphery, over at least an annular part and/or over its central part. In the example described, the refractive index of the tablet 7 progressively increases substantially between the optical axis 14 or its central part and its periphery.

The lens 11 has a refractive index that varies between its optical axis and its periphery, over at least an annular part and/or over its central part. In the example described, the refractive index of the lens 11 progressively decreases substantially between the optical axis 14 or its central part and its periphery.

To obtain the tablet 7 and the lens 11 having such variable refractive indices, the glass can be doped appropriately with metal ions chosen from, for example, sodium ($Na^+$), potassium ($K^+$), lithium ($Li^+$), silver ($Ag^+$), cesium ($Cs^+$) and thallium ($Tl^+$) ions.

There now follows a description, with examples, of how a multiplicity of tablets 7 can be fabricated.

Figure 2:
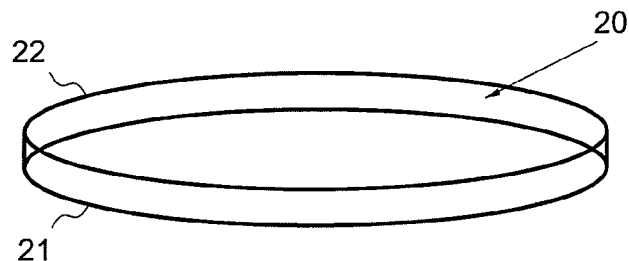
FIG. 2 represents a perspective view of a wafer of tablets.

FIG. 2 shows how it is possible to begin with a large-size wafer 20 made of glass. This wafer is, for example, previously doped substantially uniformly throughout for example with thallium ions ($Tl^+$), for example by dipping it in a thallium nitrate ($TlNO_3$) bath and under the effect of an accelerating electrical field oriented in the direction of its thickness.

FIGS. 3 to 6 illustrate a first method.

Figure 3:
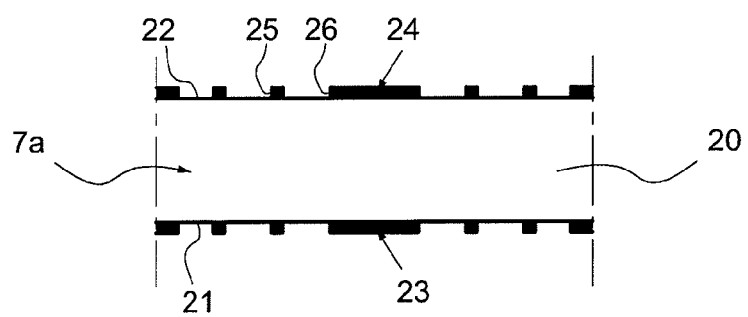
FIG. 3 represents a cross section of a portion of the wafer of FIG. 2, according to a first processing step.
Figure 4:
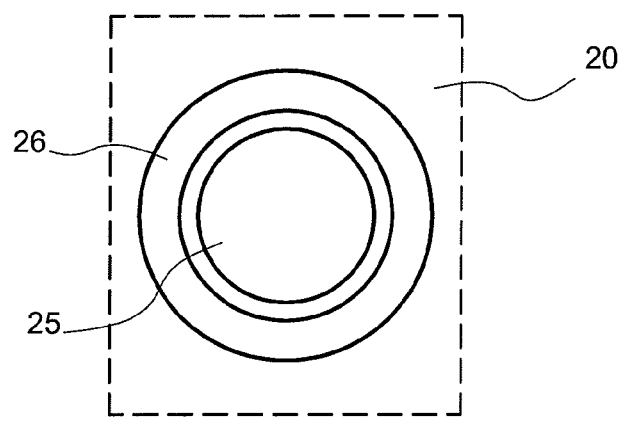
FIG. 4 represents a top view of the portion of FIG. 3.

As FIGS. 3 and 4 show, opposing masks 23 and 24, corresponding to each other in the direction of thickness of the wafer, are produced in the form of films, for example by deposition, on the faces 21 and 22 of the wafer 20. These masks are such that, on parts 7a of the wafer 20 intended to subsequently form tablets 7, a central aperture 25 and an annular aperture 26 are provided, these parts 7a being distributed in a square matrix.

Figure 5:
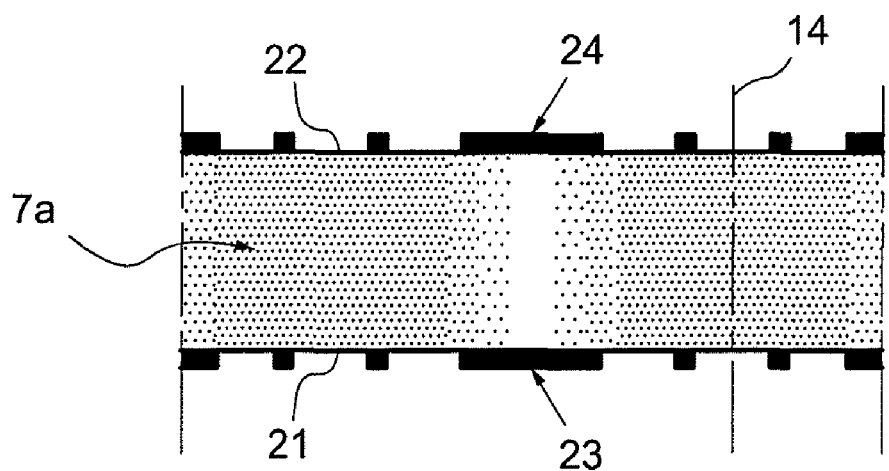
FIG. 5 represents the portion of FIG. 3, according to a subsequent processing step.

Then, as shown by FIG. 5, the wafer 20 is doped, through the masks 23 and 24, for example with sodium ions ($Na^+$), for example by dipping it in a bath of sodium nitrate ($NaNO_3$) and under the effect of an accelerating electrical field oriented in the direction of its thickness.

The masks 23 and 24 and the above doping are adapted so that the density of $Na^+$ ions contained in the material decreases substantially between the axis 14 of each part 7a or its central part and its periphery.

Figure 6:
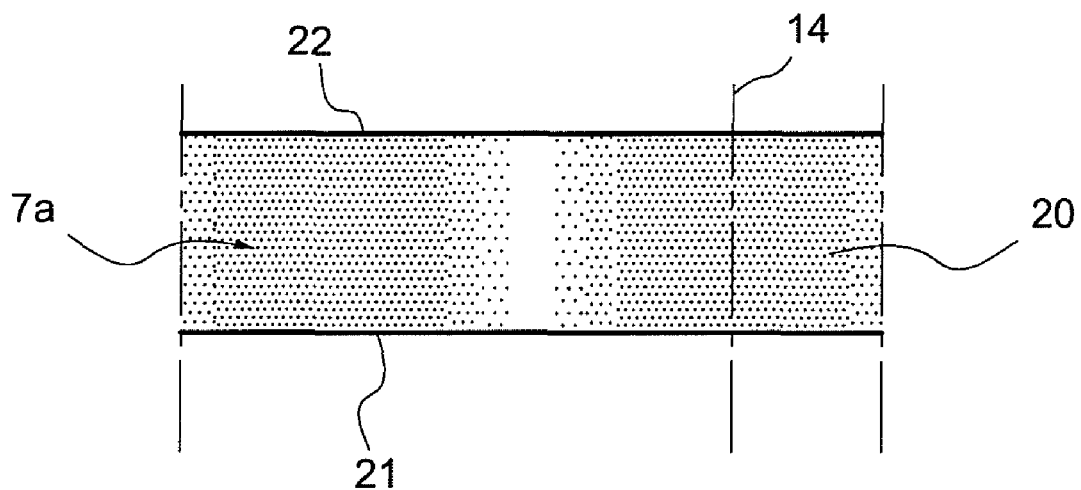
FIG. 6 represents the portion of FIG. 3, after a final processing step.

Then, as shown in FIG. 6, the masks 23 and 24 are removed.

The result of the treatment described above is that the refractive index of each part 7a of the wafer 20 increases between respectively its optical axis 14 or its central part and its periphery, in a radial gradient determined by the radial variation of the density of the doping ions in the glass.

FIGS. 7 to 11 illustrate a second way of treating the wafer 20.

Figure 7:
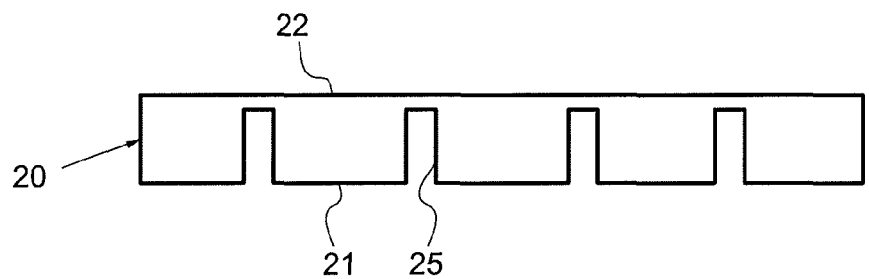
FIG. 7 represents a cross section of a portion of the wafer of FIG. 2, according to a first step of another process.
Figure 8:
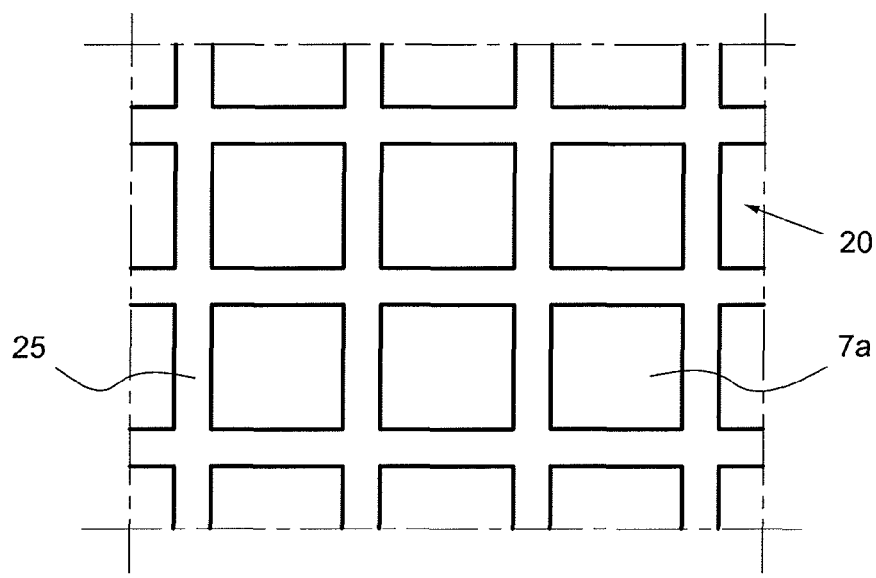
FIG. 8 represents a top view of the portion of FIG. 7.

As shown by FIGS. 7 and 8, crossed grooves 25 are formed in the front face 21 of the wafer 20, so as to form blocks 7b protruding relative to the small remaining thickness, these blocks being intended to subsequently form tablets 7 and being distributed in a square matrix. The crossed grooves 25 can be produced so as to form protruding blocks of any form, for example square or circular.

Figure 9:
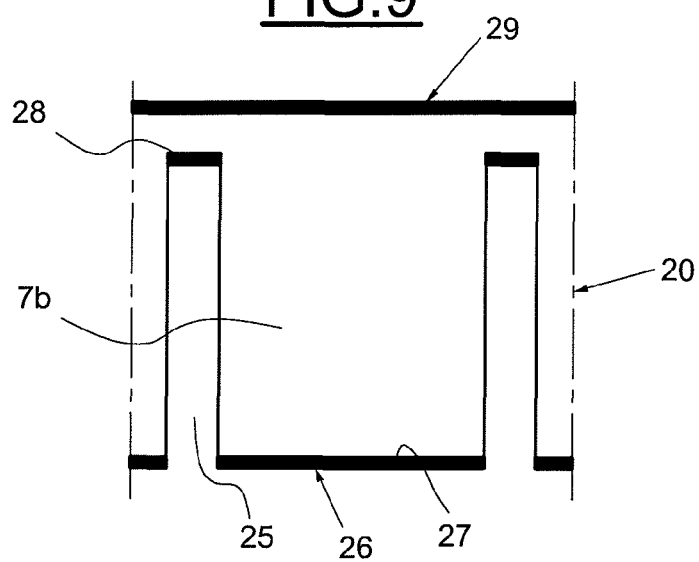
FIG. 9 represents the portion of FIG. 7, according to a subsequent processing step.

Then, as shown in FIG. 9, films are produced, for example by deposition, to form a mask 26 which covers the end faces 27 of the blocks 7b and the bottom 28 of the crossed grooves 25 and a mask 29 which completely covers the rear face 22 of the wafer 20. Thus, the sides of the blocks 7b are uncovered.

Figure 10:
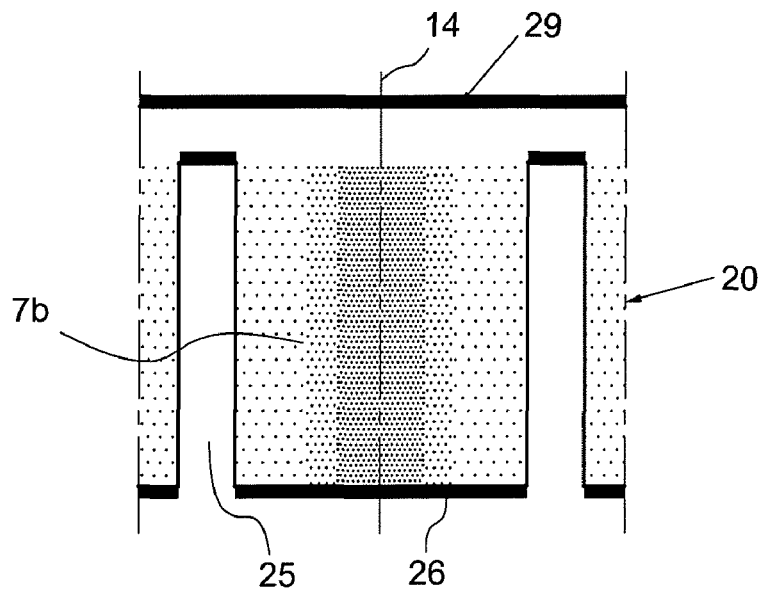
FIG. 10 represents the portion of FIG. 7, according to a subsequent processing step.

Then, as shown in FIG. 10, the blocks 7b of the wafer 20 are radially doped, via their uncovered sides, for example with thallium ions ($Tl^+$), for example by dipping the wafer 20 in a bath of thallium nitrate ($TlNO_3$).

The above doping is adapted so that the density of $Tl^+$ ions contained in the material increases substantially between the periphery of each block 7b and its central part or its axis 14.

Figure 11:
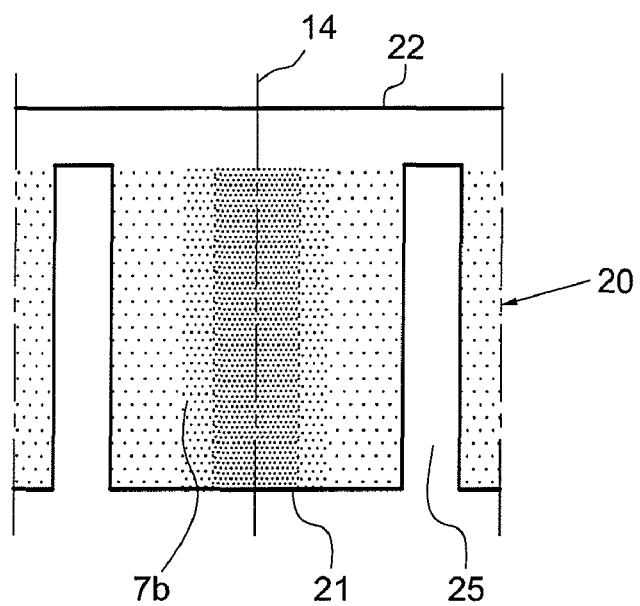
FIG. 11 represents the portion of FIG. 3, after a final processing step.

Then, as shown in FIG. 11, the masks 26 and 29 are removed.

The result of this is that the refractive index of each block 7b of the wafer 20 increases between its optical axis 14 or its central part and its periphery, in a radial gradient determined by the radial variation of the density of the doping ions in the glass.

According to another variant, it would, additionally, be possible to dope the crust of the peripheral part of the blocks 7a with sodium ions ($Na^+$), so as to slightly reduce the refractive index in the extreme peripheral part of the blocks 7a, relative to the above increase.

With reference to FIGS. 12 to 16, there now follows a description, by way of example, of how to fabricate a multiplicity of lenses 11.

Figure 12:
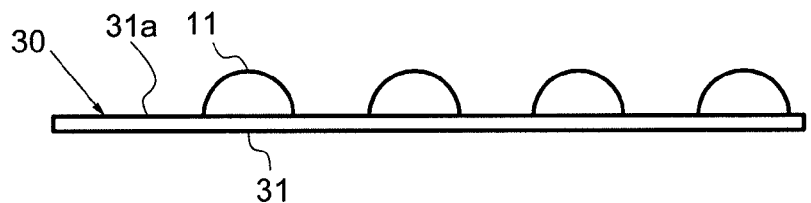
FIG. 12 represents a cross-sectional view of a wafer of optical lenses.

As shown in FIG. 12, it is possible to begin with a large-size wafer 30 made of glass, which presents a disk 31 on a front face 31a of which lenses 11 are formed, protruding on this disk, spaced and distributed according to a square matrix, the lenses being, for example, hemispherical.

There then follows a preliminary doping, overall, of the wafer 30, for example using thallium ions ($Tl^+$), for example by dipping it in a bath of thallium nitrate ($TlNO_3$).

Figure 13:
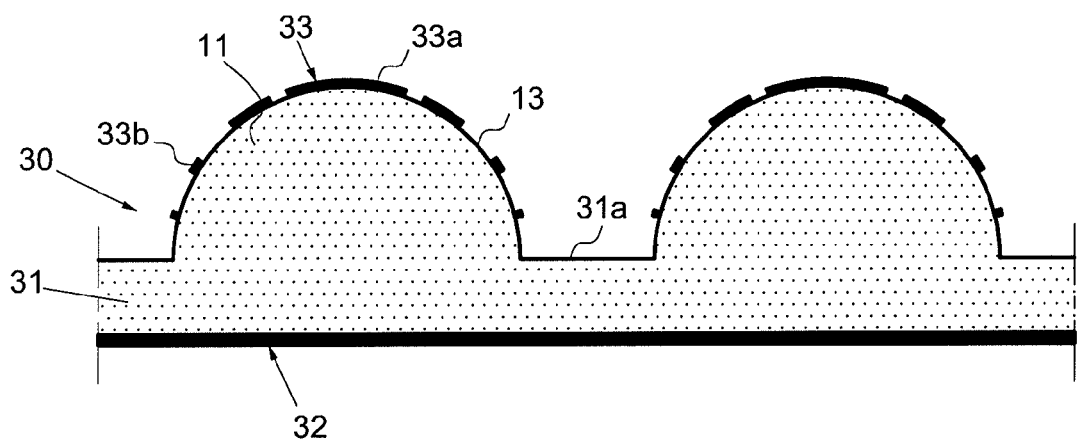
FIG. 13 represents a cross section of a portion of the wafer of FIG. 12, according to a first processing step.
Figure 14:
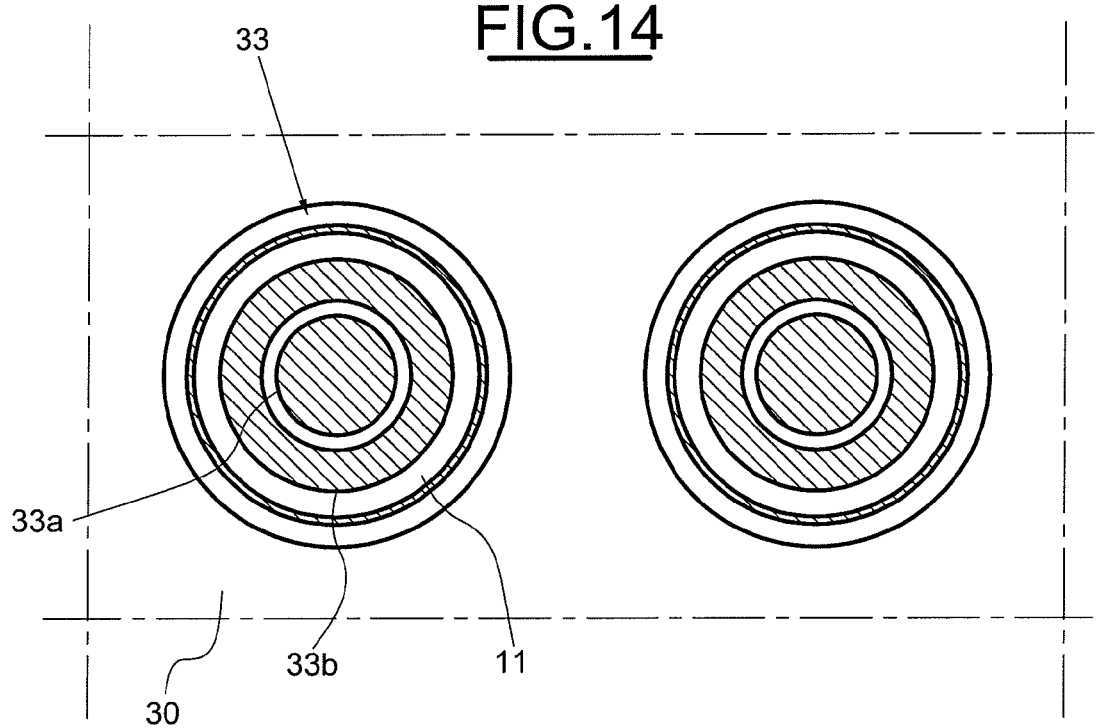
FIG. 14 represents a top view of the portion of FIG. 13.

Then, as shown in FIGS. 13 and 14, films are produced, for example by deposition, to form a mask 32 which covers the flat face of the wafer 30 and a multiplicity of masks 33 which partially cover the convex faces 13 of the lenses 11, each mask 33 comprising a round central part 33a and spaced-apart annular parts 33b leaving uncovered between them annular areas starting from this round central part.

Figure 15:
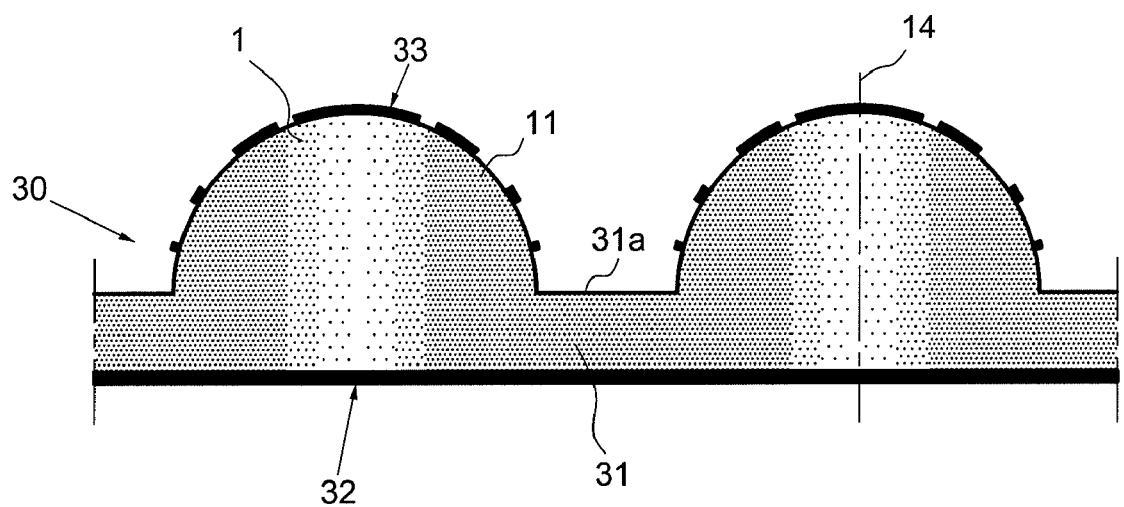
FIG. 15 represents the portion of FIG. 12, according to a subsequent processing step.

Then, as shown in FIG. 15, the wafer 30 is doped, for example with sodium ions ($Na^+$), for example by dipping it in a bath of sodium nitrate ($NaNO_3$).

The above doping is adapted so that the density of $Na^+$ ions contained in the material increases substantially between the central part or the axis 14 and the periphery of each lens 11.

Figure 16:
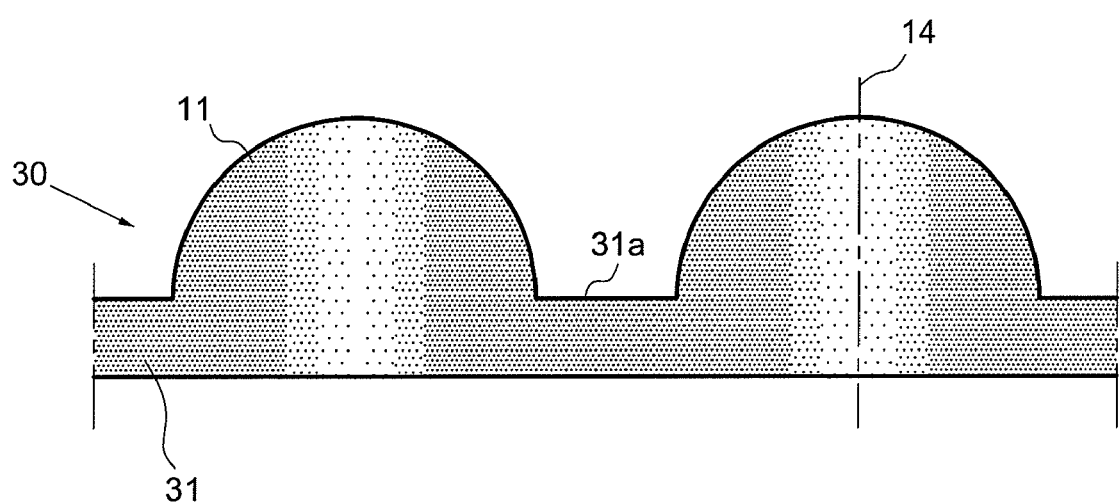
FIG. 16 represents the portion of FIG. 12, after a final processing step.

Then, as shown in FIG. 16, the masks 32 and 33 are removed.

The result of this is that the refractive index of each lens 11 of the wafer 30 decreases between its optical axis 14 or its central part and its periphery, in a radial gradient determined by the radial variation of the density of the doping ions in the glass.

There now follows a description of how a multiplicity of imaging optical modules 6 can be fabricated from wafers 20 and 30 treated as described previously.

A film 34 is produced, for example by deposition, on the face 22 of the wafer 20, providing openings 10a centered on the optical axes 14 of the parts 7a in the case of the first variant or of the blocks 7b in the case of the second variant, so as to form a multiplicity of diaphragms 10.

Then, the flat face of the wafer 30 is joined to the layer 34, via a transparent glue, so that the optical axes of the parts 7a in the case of the first variant or of the blocks 7b in the case of the second variant correspond to the optical axes of the lenses 11.

There is thus obtained, as shown in FIG. 17, a wafer 35 comprising a multiplicity of imaging optical modules 6 distributed in a square matrix.

Having a wafer 37 comprising a multiplicity of semiconductor components 3 distributed in a square matrix, this wafer 37 is joined to the face 21 of the wafer 20 included in the wafer 35 so that the optical axes of the imaging optical modules 6 correspond to the optical axes of the sensors 5 of the semiconductor components 3.

There is thus obtained, as shown in FIG. 18, a wafer 38 comprising a multiplicity of stacks 2.

Then, this wafer 38 is sawn so as to separate and cut out each of the stacks 2, each consisting of a semiconductor component 3 and an imaging optical module 6, as described with reference to FIG. 1.

As an example, on the one hand, the tablet 7 can have a width of between 3 and 5 mm and a thickness of between 1 and 3 mm and on the other hand the lens 11 can have a radius of between 1.3 and 1.7 mm and a thickness of between 0.5 and 1.5 mm.

In addition, the variation of the refractive index of the tablet 7 and, conversely, of the lens 11, between its central part and its peripheral part can, as a percentage, be between 4 and 9%. Purely as an example, this variation can take the form of a parabola, the tip of which would be approximately at half the radius of the tablet or of the lens.

The present invention is not limited to the examples described. It also applies to any stacking of any number of lenses and/or of tablets, separated or not by air, containing at least one element having a non-zero index gradient, radial in particular.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A method, comprising:
    applying opposing first and second masks with openings which correspond to each other on top and bottom surfaces, respectively, of an optical member;
    wherein the first and second masks are patterned to define, as the openings, a central aperture and at least one annular aperture;
    first doping of the optical member through the openings in the first and second masks with a first dopant;
    wherein the first doping produces a density of the first dopant in the optical member that decreases radially extending from a central axis of the central aperture; and
    removing the first and second masks.

2. The method of claim 1 wherein applying opposing first and second masks comprises depositing the masks in the form of a film.

3. The method of claim 1 wherein first doping comprises dipping the optical member with the first and second masks in a bath of first doping material and applying an accelerating electrical field to the optical member that is oriented is a direction perpendicular to the top and bottom surfaces.

4. The method of claim 3 wherein the first doping material is $NaNO_3$ and the first dopant is sodium ions.

5. The method of claim 1 wherein the optical member is an optical wafer, the first and second masks being applied in a matrix.

6. The method of claim 1 wherein the top and bottom surfaces are flat and parallel to each other.

7. The method of claim 1, further comprising, before applying the opposing first and second masks, second doping of the optical member with a second dopant.

8. The method of claim 7 wherein the second doping produces a density of the second dopant in the optical member that is uniformly distributed.

9. The method of claim 7 wherein second doping comprises dipping the optical member in a bath of second doping material and applying an accelerating electrical field to the optical member that is oriented is a direction perpendicular to the top and bottom surfaces.

10. The method of claim 9 wherein the second doping material is $TlNO_3$ and the second dopant is thallium ions.

11. A method, comprising:
    forming a groove in a first surface of an optical member, the formed groove surrounding a protruding block;
    applying a first mask completely covering the first surface on the protruding block and a bottom surface of the of the groove, the second mask not covering side walls of the groove;
    applying a second mask completely covering a second surface of the optical member opposite at least the groove and protruding block;
    first doping of the optical member through the uncovered side walls of the groove with a first dopant;
    removing the first and second masks.

12. The method of claim 11 wherein applying opposing first and second masks comprises depositing the masks in the form of a film.

13. The method of claim 11 wherein first doping comprises dipping the optical member with the first and second masks in a bath of first doping material.

14. The method of claim 11 wherein the first doping material is TlNO3 and the first dopant is thallium ions.

15. The method of claim 11 wherein the optical member is an optical wafer, the groove is formed in a matrix.

16. The method of claim 11 wherein the first and second surfaces are flat and parallel to each other.

17. The method of claim 11, further comprising second doping of peripheral parts of the protruding block with a second dopant.

18. The method of claim 17 wherein the second dopant is sodium ions.

19. A method, comprising:
    applying a first mask with openings on a convex top surface of an optical member;
    applying a second mask completely covering a bottom surface of the optical member;
    first doping of the optical member through the first mask with a first dopant;
    removing the first and second masks.

20. The method of claim 19 wherein applying the first and second masks comprises depositing the masks in the form of a film.

21. The method of claim 19 wherein the first mask is patterned to define a plurality of annual apertures surrounding a covered central part, and wherein the first doping produces a density of the first dopant in the optical member that increases radially extending from a central axis of the convex top surface.

22. The method of claim 19 wherein first doping comprises dipping the optical member with the first and second masks in a bath of first doping material.

23. The method of claim 22 wherein the first doping material is NaNO3 and the first dopant is sodium ions.

24. The method of claim 19 wherein the optical member is an optical wafer, the first and second masks being applied in a matrix.

25. The method of claim 19 further comprising, before applying the opposing first and second masks, second doping of the optical member with a second dopant.

26. The method of claim 25 wherein the second doping produces a density of the second dopant in the optical member that is uniformly distributed.

27. The method of claim 26 wherein second doping comprises dipping the optical member in a bath of second doping material.

28. The method of claim 27 wherein the second doping material is TlNO3 and the second dopant is thallium ions.

29. A method of fabricating an imaging optical element, comprising:
doping a material forming said imaging optical element with doping ions suitable for modifying a refractive index of the imaging optical element, such that the refractive index varies between an optical axis of the imaging optical element and its periphery, over at least an annular area, the doping being performed through an opening in a mask applied to at least one surface of the imaging optical element;
wherein doping comprises doping the material of the imaging optical element with thallium ions, that material having been previously uniformly doped with sodium ions.

30. A method of fabricating an imaging optical element, comprising:
doping a material forming said imaging optical element with doping ions suitable for modifying a refractive index of the imaging optical element, such that the refractive index varies between an optical axis of the imaging optical element and its periphery, over at least an annular area, the doping being performed through an opening in a mask applied to at least one surface of the imaging optical element;
wherein doping comprises doping the material of the imaging optical element with sodium ions, that material having been previously uniformly doped with thallium ions.

31. A method, comprising:
forming on an imaging optical element a mask having at least one annular aperture surrounding a covered region, said mask applied to at least one surface of the imaging optical element;
doping a material forming said imaging optical element with doping ions suitable for modifying a refractive index of the imaging optical element, such that the refractive index varies between an optical axis of the imaging optical element and its periphery, over at least an annular area;
wherein doping comprises performing the doping of the imaging optical element through the at least one annular aperture of the mask; and
removing said mask.

32. A method, comprising:
forming on an imaging optical element a mask having a central aperture and at least one annular aperture surrounding the central aperture, said mask applied to at least one surface of the imaging optical element;
doping a material forming said imaging optical element with doping ions suitable for modifying a refractive index of the imaging optical element, such that the refractive index varies between its optical axis and its periphery, over at least an annular area
wherein doping comprises performing the doping of the imaging optical element through the central and annular apertures of the mask; and
removing said mask.

33. A method, comprising:
forming a groove in a front face of an imaging optical element, the formed groove surrounding a protruding block;
forming a mask covering a rear face of the imaging optical element, the front face at the protruding block and a bottom surface of said groove, wherein sidewalls of the groove are uncovered by the mask and define an opening;
doping a material forming said imaging optical element with doping ions suitable for modifying a refractive index of the element, such that the refractive index varies between an optical axis of the imaging optical element and its periphery, over at least an annular area;
wherein the doping is performed through the opening; and
removing said mask.

34. A method of fabricating an imaging optical element, comprising:
doping a material forming said imaging optical element with doping ions suitable for modifying a refractive index of the imaging optical element, such that the refractive index varies between an optical axis of the imaging optical element and its periphery, over at least an annular area, the doping being performed through an opening in a mask applied to at least one surface of the imaging optical element;
wherein doping comprises:
forming on said imaging optical element the mask covering a rear face of the imaging optical element and having on a front face of the imaging optical element a central aperture and/or at least one annular aperture;
doping the element through said mask; and
removing said mask.

* * * * *